(12) United States Patent
Ren et al.

(10) Patent No.: US 11,287,459 B2
(45) Date of Patent: Mar. 29, 2022

(54) MAGNETIC PHOTOACOUSTIC COMPOSITE NON DESTRUCTIVE TESTING DEVICE OF POWER TRANSMISSION LINE OF PHOTOVOLTAIC GRID BASED ON CORONA EFFECT

(71) Applicant: North University of China, Shanxi (CN)

(72) Inventors: Yifeng Ren, Shanxi (CN); Changxin Chen, Shanxi (CN); Junmei Zhao, Shanxi (CN); Shuncai Yao, Shanxi (CN); Wenhua Zhang, Shanxi (CN); Dongxing Pei, Shanxi (CN); Tiehua Ma, Shanxi (CN)

(73) Assignee: North University of China, Taiyuan (CN)

( * ) Notice: Subject to any disclaimer, the term of this patent is extended or adjusted under 35 U.S.C. 154(b) by 5 days.

(21) Appl. No.: 16/941,582

(22) Filed: Jul. 29, 2020

(65) Prior Publication Data

US 2021/0033658 A1 Feb. 4, 2021

(30) Foreign Application Priority Data

Jul. 30, 2019 (CN) .......................... 201910694549.8

(51) Int. Cl.
*G01R 31/08* (2020.01)
(52) U.S. Cl.
CPC .................................. *G01R 31/085* (2013.01)

(58) Field of Classification Search
CPC .... G01R 31/08; G01R 31/081; G01R 31/083; G01R 31/085; G01R 31/086; G01R 31/12–1272; G01D 21/02
See application file for complete search history.

(56) References Cited

U.S. PATENT DOCUMENTS

| 10,440,472 | B2 * | 10/2019 | Miller | .................... H04R 1/326 |
| 2014/0270205 | A1 | 9/2014 | Miller | |
| 2017/0045571 | A1 * | 2/2017 | Joseph | ................. G01R 15/186 |

FOREIGN PATENT DOCUMENTS

| CN | 105866626 A | 8/2016 |
| CN | 106932685 A | 7/2017 |
| CN | 108088500 A | 5/2018 |
| CN | 108802586 A | 11/2018 |

(Continued)

*Primary Examiner* — Tung X Nguyen
*Assistant Examiner* — Feba Pothen
(74) *Attorney, Agent, or Firm* — Gang Yu

(57) ABSTRACT

Disclosed is a magnetic photoacoustic composite non destructive testing device for a power transmission line of a photovoltaic grid based on a corona effect. The device may include a mechanical structure part and a data processing part. The mechanical structure part may include a shielding shell and mounting bases, shielding bodies are mounted on two sides of the shielding shell, a top of the shielding shell is provided with an upper cover, two sides under the upper cover are provided with the mounting base respectively, and the two mounting bases are located above the shielding bodies respectively. The data processing part may include a pair of optical sensing modules, a pair of magnetic sensing modules, an acoustic sensing module, a humidity sensing module, a micro-processor, a signal conditioning and transmission unit and an internal power supply management module.

7 Claims, 4 Drawing Sheets

(56) References Cited

FOREIGN PATENT DOCUMENTS

| | | | |
|---|---|---|---|
| CN | 108872794 | A | 11/2018 |
| CN | 109243130 | A | 1/2019 |
| CN | 109683033 | A | 4/2019 |
| CN | 109765461 | A | 5/2019 |
| KR | 101969285 | B1 | 4/2019 |
| RU | 2488837 | C1 | 7/2013 |

\* cited by examiner

MAGNETIC PHOTOACOUSTIC COMPOSITE NON DESTRUCTIVE TESTING DEVICE OF POWER TRANSMISSION LINE OF PHOTOVOLTAIC GRID BASED ON CORONA EFFECT

CROSS-REFERENCE TO RELATED APPLICATIONS

This application claims priority to Chinese Patent Application No. 201910694549.8, filed Jul. 30, 2019, entitled "Magnetic Photoacoustic Composite non Destructive Testing Device of Power Transmission Line based on Corona Effect". The above identified application is hereby incorporated herein by reference in its entirety.

TECHNICAL FIELD

The disclosure relates to a magnetic photoacoustic composite non destructive testing device of a power transmission line of a photovoltaic grid based on a corona effect, belongs to the field of non destructive testing technologies of a power transmission line of an intelligent grid. The disclosure particularly relates to a device for determining a breakage position and breakage strength. The device captures a signal through magnetic, optical and acoustic detection sensors inside the device by using a step corona at a breakage of a high-voltage power transmission line of the intelligent grid and by that the magnetic, optical and acoustic change accompanied by corona effect, as to ascertain the breakage position and the breakage strength.

BACKGROUND

A corona effect is an ionizing phenomenon of air around a conductor in presence of a strong electric field, and the generation of the corona effect is associated with the conductor itself and conditions of the air around the conductor. A corona effect is generated due to a non-uniform electric field as a result of an uneven conductor. When a voltage nearby an electrode with a small radius of curvature around the non-uniform electric field is increased to a certain value, discharging may occur once the air is free, and accordingly the corona is formed. The corona is one of the main reasons of power loss in a power system. A discharging current of the corona is associated with humidity and a flow velocity of the air.

Running of a power transmission line exposed in the air may be directly influenced by an atmospheric environment. A great deal of acid gas and solid particles discharged by industrial enterprises may generate a series of physical and chemical reactions with an aluminium conductor of an outer layer of the power transmission line under a long-term effect of water and oxygen. In this way, a status change of the outer layer of the conductor is caused, and accordingly damage of an oxidation film and dissolution of exposed aluminium may be directly caused. In Southern China, a degree of corrosion on a surface of the aluminium conductor is high as a result of a high temperatures, high relative humidity of the air, a long rainfall time, serious industrial pollution and the like, and accordingly the conductor is increasingly roughened. In a coastal region, corrosion on the surface of the aluminium conductor is accelerated due to increasing salt-containing particles and rising humidity of a marine atmosphere, thereby leading to a further rise of its degree of roughness. As for conductors with the identical model, a degree of discharging due to the corona of the conductor after running for a long time may be severer than that of a new conductor in presence of an identical voltage applied. The degree of corrosion and the degree of roughness of the conductor of the coastal region are further improved compared with those of the conductor in an inland region, therefore a severity of the discharging is more significant. Thus, timely detection of a status of a cable by making full use of the corona effect has become an indispensable research content.

A non destructive testing technology may not cause any damage to a component. A non destructive testing is to judge whether there is a defect inside and on a surface of the component by using a phenomenon that physical properties of a material may be changed due to the defect on the premise that the component is not damaged, without causing any damage to the material, a workpiece and a device. A position, a size and a level of harm of the defect should be found, and development of the defect should be forecasted and predicted. The non destructive testing provides an effective method for this purpose.

A multi-sensor information fusion technology implements multi-level and multi-dimensional information complementation and optimized combination of various sensors, to finally generate a consistent explanation of an observation environment. During the process, multi-source data should be fully utilized to control and use reasonably, while a final objective of information fusion is to export more useful information through a multi-level and all-round combination of information on the basis of separate observation information obtained by each of the sensors. An advantage of a cooperative operation of the multiple sensors is utilized, and data of other information sources is comprehensively processed to improve intelligentization of a whole sensor system.

SUMMARY

The disclosure is intended to provide a magnetic photoacoustic composite non destructive testing device of a power transmission line of a photovoltaic grid based on a corona effect, and especially the device captures a signal through magnetic, optical and acoustic detection sensors inside the device by using a step corona (high intensity corona, i.e. the corona greater than that emitted by normal ionized air) at a breakage of a high-voltage power transmission line and by that the magnetic, optical and acoustic changes accompanied by the corona effect, as to ascertain a breakage position and breakage strength.

The disclosure provides a magnetic photoacoustic composite non destructive testing device of a power transmission line of a photovoltaic grid based on a corona effect. The device may include a mechanical structure part and a data processing part.

The mechanical structure part may include a shielding shell and mounting bases, shielding bodies are mounted on two sides of the shielding shell, a top of the shielding shell is provided with an upper cover, two sides under the upper cover are provided with the mounting base respectively, the two mounting bases are located above the shielding bodies respectively, mounting holes are uniformly distributed on the mounting base, and one end of the upper cover is provided with an air inlet passage and an air outlet passage; the air inlet passage and the air outlet passage run through a shielding sleeve, and are distributed on two sides of the shielding sleeve and tangential to the shielding sleeve; a shielding layer made up of aluminium, silicon steel and copper respectively from the outside to the inside is applied to the shielding sleeve and the shielding shell;

the data processing part may include a pair of optical sensing modules, a pair of magnetic sensing modules, an acoustic sensing module, a humidity sensing module, a micro-processor, a signal conditioning and transmission unit and an internal power supply management module; wherein each of the optical sensing modules may include an optical probe, an optical fiber transmission passage, a photoelectric coupling module, and is connected with the signal conditioning and transmission unit; each of the magnetic sensing modules may include a magnetic sensor, and is connected with a limiting circuit, a voltage comparator and a signal conditioning circuit; the acoustic sensing module is mainly configured to detect loudness and a frequency of a sound given out in presence of the corona effect, and is connected with a filtering, amplifying and limiting signals conditioning circuit; the humidity sensing module is configured to detect relative humidity of air, to accordingly ensure that a threshold of a corona given out due to a breakage is set and identified in a self-adapting manner; voltages of the four groups of sensing modules are transmitted to a signal conditioning and change-over module, and then transmitted to a minimum system for decision judgment or storage and transmission;

the acoustic sensing module, the internal power supply management module, the micro-processor and the signal conditioning and transmission unit for conditioning acoustic, optical, magnetic, humidity and internal voltage signals are fixed on a medial axis of a bottom surface one by one, are arrayed one by one from the left to the right at regular intervals, and kept an identical distance with a left inner wall and a right inner wall of the housing; a first magnetic sensor is tightly attached to a rear inner wall of the housing and is fixed on a left side, but is not tangential to the left inner wall; a second magnetic sensor is tightly attached to a front inner wall of the housing and is fixed on a right side, but is not tangential to the right inner wall; the two sides are maintained at the same level; the humidity sensing module is fixed on a bottom of the upper cover of the shielding shell, tightly attached to the upper cover and fixed with a screw; the air inlet passage penetrates into a shell through the shielding sleeve and is connected with the humidity sensing module; the humidity sensing module is connected with the air outlet passage, and the air outlet passage goes through the shell through the shielding sleeve; the humidity sensing module may include a fan (a small fan embedded into the humidity sensing module and encapsulated therein) capable of being controlled through positive and negative pulse therein; in case of the positive pulse, the fan may rotate positively, the air inlet passage may take the air inwards, and the air outlet passage may discharge the air; in case of the negative pulse, the fan may rotate negatively, the air inlet passage may discharge the air, and the air outlet passage may take the air inwards; the humidity sensing module is designed to prevent relative ambient humidity detection accuracy of a humidity sensor from being influenced due to blocking of a dustproof cover of the air inlet passage and the air outlet passage as a result of dust.

The magnetic sensor is an induction coil; the front inner wall and the rear inner wall of the composite non destructive testing device are respectively provided with a magnetic induction coil, wherein the two magnetic induction coils are fixed at the same level symmetrically; in this way, a differential signal is formed and input to a signal conditioning terminal. A reason why the magnetic induction coils are configured like this is that the differential signal in the shielding body is output as 0V after being conditioned if there is no corona due to the breakage when the composite non destructive testing device is mounted just below or above a high-voltage line vertically, and when the mounted device swings around the high-voltage line, influence of swinging may still be neglected as long as the mounted device (for example, an unmanned aerial vehicle and an inspection robot) rotates around an axis and a distance from a central point of the coil to a high-voltage axis is equal. Therefore, there is a certain requirement for a mounting mode of the mounted device here. In case of the corona as a result of the breakage, a left (front) coil may sense a step signal first, while a right (rear) signal may not achieve a place where the corona as a result of the breakage occurs yet, Therefore, a certain signal (greater than 0V and showing a positively correlated change with a degree of breakage) may be output by conditioning of the differential signal. An output of this signal is one of criteria of judging whether there is a severe corona caused by a broken cable.

There may be calculations corresponding to different shielding efficiency in allusion to the power transmission lines of different specifications here, and the shielding body may be designed differently. Therefore, in order to prevent the corona from generating an overvoltage or being applied to the power transmission lines of the different specifications, correction should be implemented before application (correction of a mounting position, an output electric potential is 0; correction of sensing, an output corona value should be not less than or greater than a corresponding detection threshold). The magnetic sensing module may not only be configured to detect a step magnetic field (the differential signal) from the corona, but detect a size of a magnetic field inside the shielding shell in presence of an electric field formed by cables of different specifications in the beginning, to accordingly adjust an upper limit, and a lower limit of a sensing sensitive area.

The internal power supply management module in the device is to stabilize a voltage of an incoming power supply and ensure that an internal circuit runs normally. Meanwhile, the power supply module is provided with a positive/negative power supply and a PWM generator, as to provide power to a drainage pump inside the humidity sensing module. The positive/negative power supply further provides the power to the signal conditioning and transmission unit (including an amplifier) inside the device, and the positive power supply may provide the power to the acoustic sensing module, the humidity sensing module, the optical sensing module, the micro-processor and the signal conditioning and transmission unit.

The acoustic sensing module is mainly configured to capture a difference between a frequency generated by ionized air and a frequency of an inherent environment, and a difference between loudness of noise generated by the corona and loudness of noise in the inherent environment. An output of this signal is one of the criteria of judging whether there is the severe corona caused by the broken cable.

Two sides of the composite non destructive testing device are additively provided with the shielding bodies, and a dedicated degaussing S-shaped optical path passage reserved for optical fibers to transmit a light beam are respectively configured inside the shielding bodies. An output of an optocoupler inside the composite non destructive testing device is one of the criteria of judging whether there is the severe corona caused by the broken cable. If the inside and the outside of the device are connected directly through a through hole, there may be a magnetic sensing line and an electric field line penetrating into the shielding body through a gap of the device. Therefore, an S-shaped embedded design is taken, which can effectively prevent the internal circuit from being interfered by a magnetic flux leakage.

The air inlet passage and the air outlet passage run through the shielding sleeve. The air inlet passage and the air outlet passage are tangential to a bending portion of the shielding sleeve inside the shielding sleeve between the air inlet passage and the air outlet passage, and a remaining space is a dedicated passage reserved for the lines connecting with the inside and the outside of the device. An apparatus (for example, the unmanned aerial vehicle, the inspection robot and the like) on which the composite non destructive testing device is mounted usually provides the power to the internal power supply management module inside the device. Detected data also needs to be transmitted outward to the mounted device. A fixation hole and a bracket for mounting the device are designed according to natural standards and are of universality.

In order to reduce secondary electromagnetic interference and improve reliability, a local shielding and isolating layer should be added to the internal important signals conditioning and transmission unit, the power supply management module and the micro-processor (added outside each separate module), as to ensure reliability of the signal and decrease the interference.

The disclosure provides an embodiment of the abovementioned device and obtains an initial voltage with the magnetic sensor while obtaining initial humidity of the air with the humidity sensor, in this way a threshold of a detection environment is determined in the self-adapting manner. When it exceeds a normal threshold, an outer surface of the cable is initially determined to have the breakage (a fracture or a burr), and the interference due to the corona sensed through the air humidity and an inherent voltage is eliminated according to the magnetic field strength monitored by the magnetic sensor, the light intensity obtained by an optical sensor, and the frequency and loudness of an acoustic sensor. Then, breakage information is sent into the processor first by the signal conditioning module for normalization and subjected to weighting with a Delphi method, as to determine and record a breakage point.

The disclosure has the following beneficial effects.

The device of the disclosure may make full use of properties of a live high-voltage power transmission line (there is a strong electromagnetic field, and there is an abnormal corona at the breakage), eliminate former superimposed interference through a scientific and reasonable method and accurately position the breakage position thereof, thereby facilitating a worker to inspect and maintain subsequently.

BRIEF DESCRIPTION OF THE. DRAWINGS

Figure 1:
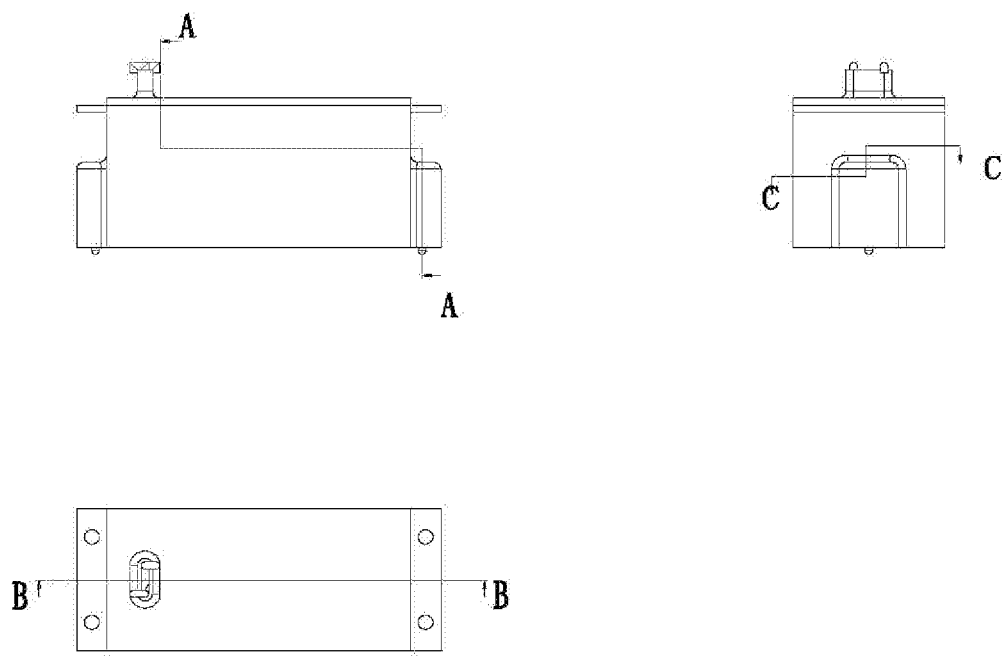
FIG. 1 is three views of a composite non destructive testing device.

In the drawings: 1—mounting base, 2—mounting hole, 3—air inlet passage, 4—air outlet passage, 5—shielding sleeve, 6—upper cover, 7—shielding shell, 8—optical path shielding body, 9—humidity sensing module, 10—acoustic sensing module, 11—internal power supply management module, 12—micro-processor, 13—signal conditioning and transmission unit, 14—dedicated S-shaped optical path passage, 15—hole allowing an optical path to penetrate into the shielding shell, 16a—first optical sensor probe, 16b—second optical sensor probe, 17a—first magnetic sensor, and 17b—second magnetic sensor.

DETAILED DESCRIPTION OF THE EMBODIMENTS

The disclosure will be further described below through embodiments, and will not be limited to the following embodiments.

Embodiment 1

Figure 2:
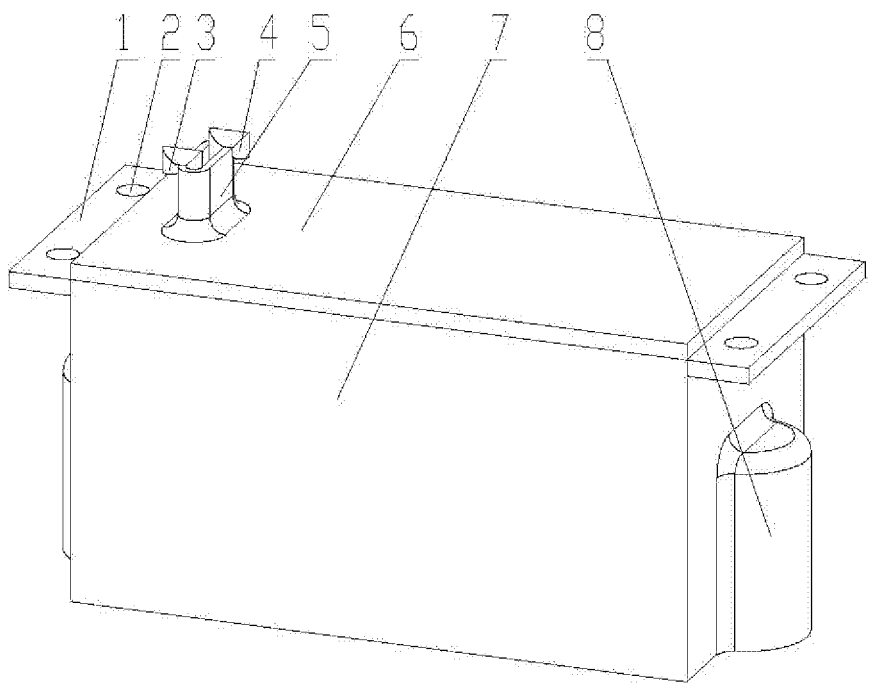
FIG. 2 is a three-dimensional appearance schematic diagram of a composite non destructive testing device.
Figure 3:
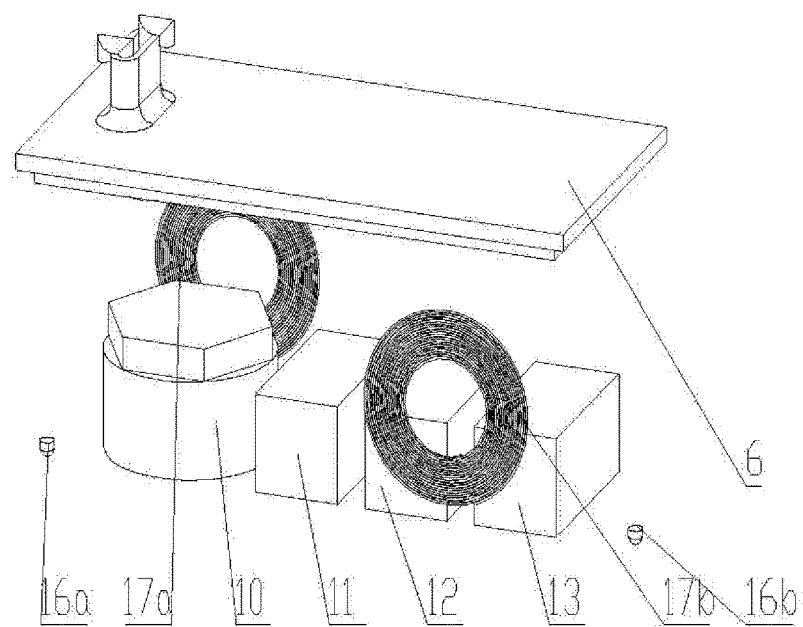
FIG. 3 is a three-dimensional internal schematic diagram of a composite non destructive testing device.
Figure 4:
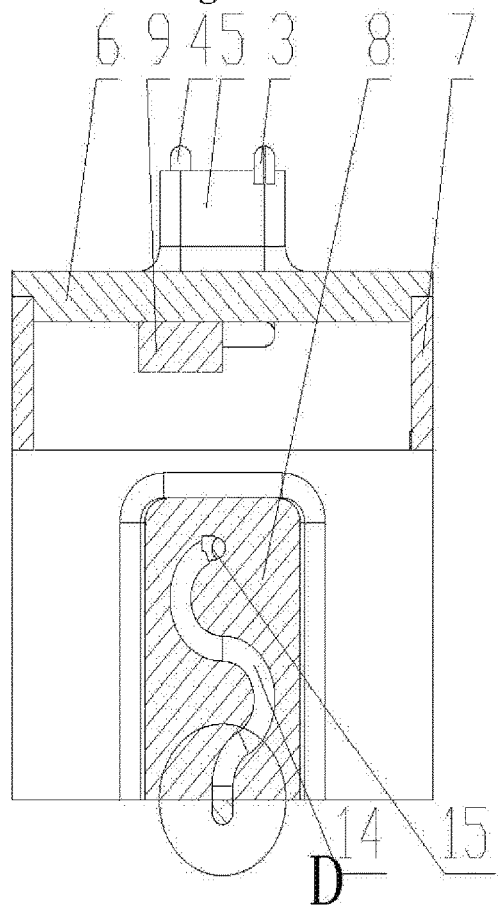
FIG. 4 is a section view of a front view of a composite non destructive testing device in an A-A direction.
Figure 5:
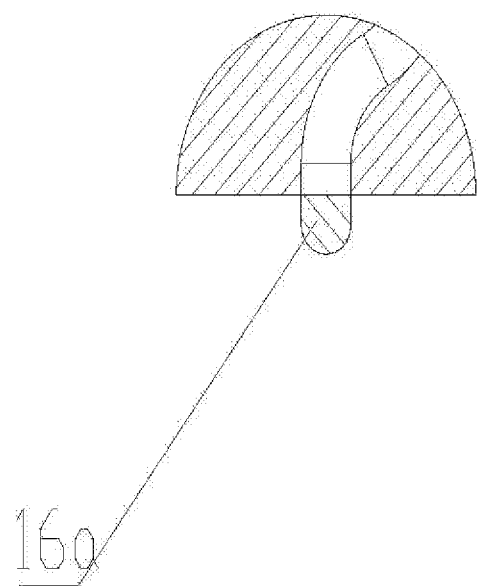
FIG. 5 is a local view of a part D.
Figure 6:
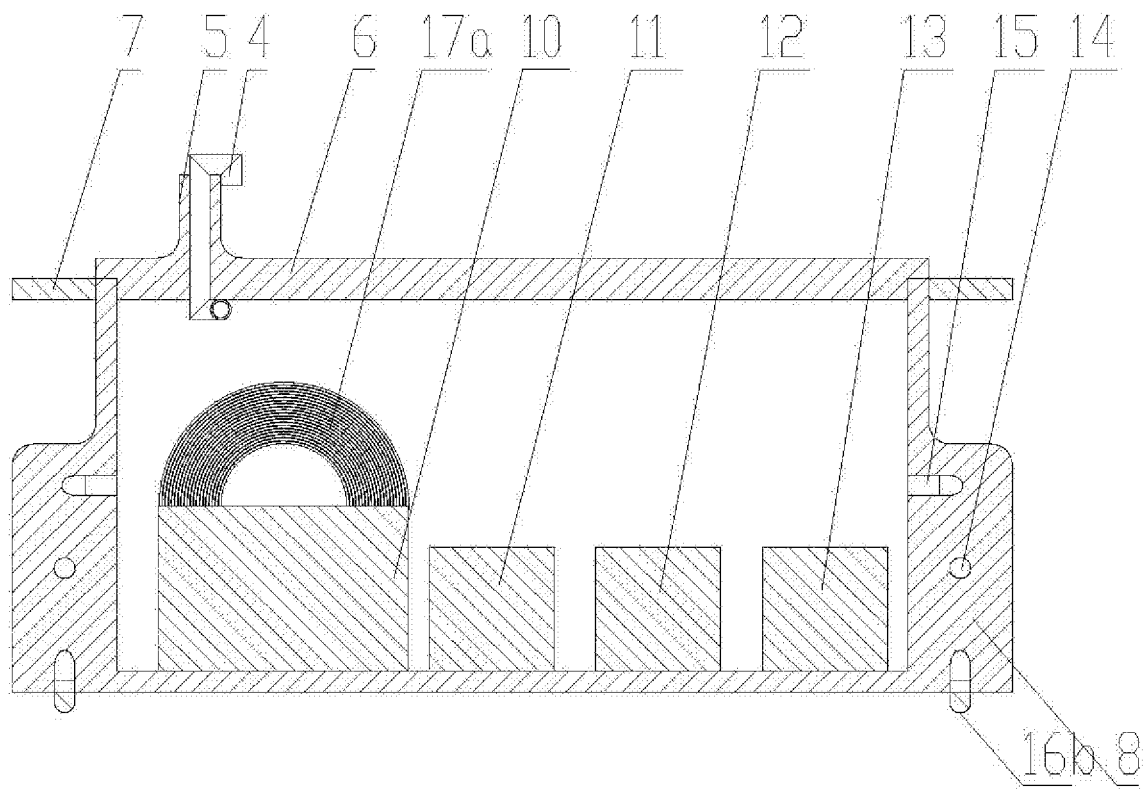
FIG. 6 is a section view of a top view of a composite non destructive testing device in a B-B direction.
Figure 7:
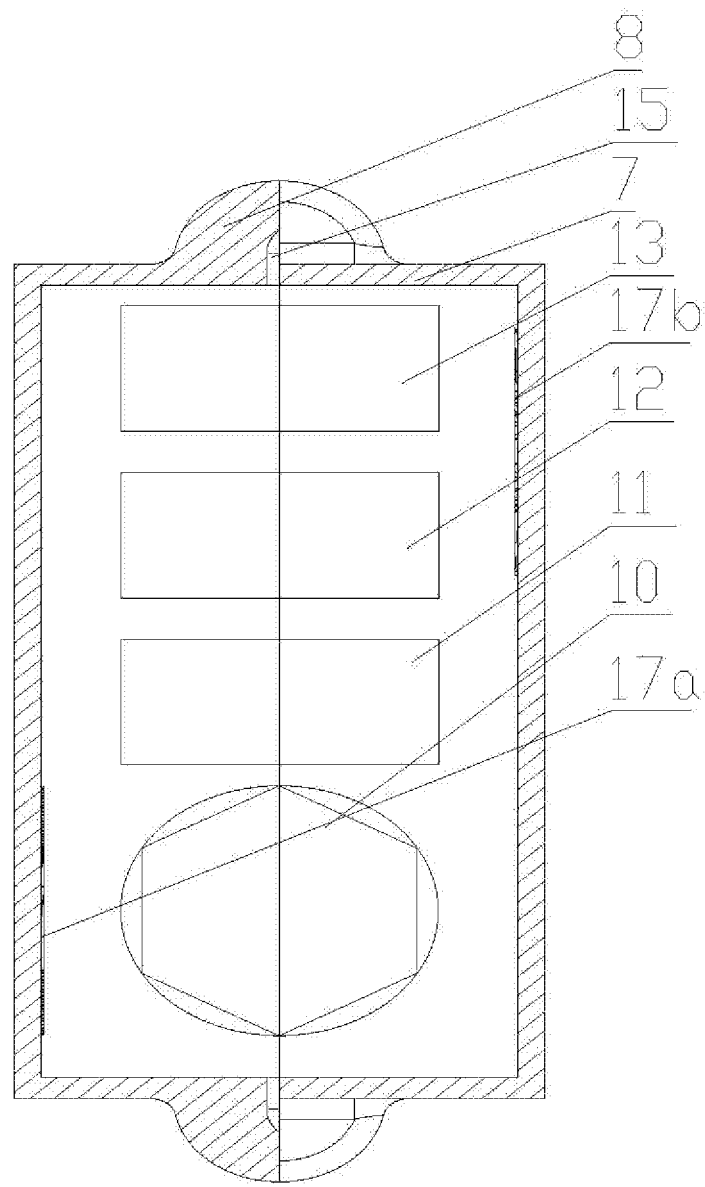
FIG. 7 is a section view of a left view of a composite non destructive testing device in a C-C direction.

As shown in FIG. 1-FIG. 7, a magnetic photoacoustic composite non destructive testing device of a power transmission line of a photovoltaic grid based on a corona effect may include a mechanical structure part and a data processing part.

The mechanical structure part may include a shielding shell 7 and mounting bases 1, optical path shielding bodies 8 are mounted on two sides of the shielding shell 7, a top of the shielding shell 7 is provided with an upper cover 6, two sides under the upper cover 6 are provided with the mounting base 1 respectively, the two mounting bases 1 are located above the optical path shielding bodies 8 respectively, mounting holes 2 are uniformly distributed on the mounting base 1, and one end of the upper cover 6 is provided with an air inlet passage 3 and an air outlet passage 4. The air inlet passage 3 and the air outlet passage 4 run through a shielding sleeve 5, and are distributed on two sides of the shielding sleeve and tangential to the shielding sleeve. A shielding layer made up of aluminium, silicon steel and copper respectively from the outside to the inside is applied to the shielding, sleeve and the shielding shell.

The data processing part may include a pair, of optical sensing modules, a pair of magnetic sensing modules, an acoustic sensing module, a humidity sensing module, a micro-processor, a signal conditioning and transmission unit and an internal power supply management module. Herein, each of the optical sensing modules may include an optical probe, an optical fiber transmission passage, a photoelectric coupling module, and is connected with the signal conditioning and transmission unit. Each of the magnetic sensing modules may include a magnetic sensor, and is connected with a limiting circuit, a voltage comparator and a signal conditioning circuit. The acoustic sensing module is mainly configured to detect loudness and a frequency of a sound given out in presence of the corona effect, and is connected with a filtering, amplifying and limiting signals conditioning circuit. The humidity sensing module is configured to detect relative humidity of air, as to accordingly ensure that a threshold of a corona given out due to a breakage is set and identified in a self-adapting manner. Voltages of the four groups of sensing modules are transmitted to a signal conditioning and change-over module, and then transmitted to a minimum system for decision judgment or storage and transmission.

The acoustic sensing module 10, the internal power supply management module 11, the micro-processor 12 and the signal conditioning and transmission unit 13 for conditioning the acoustic, optical, magnetic, humidity and internal voltage signals are fixed on a medial axis of a bottom surface one by one, arrayed one by one from the left to the right at regular intervals, and kept an identical distance with a left inner wall and a right inner wall of the housing. A first magnetic sensor 17a is tightly attached to a rear inner wall of the shielding shell 7 and fixed on a left side, but is not tangential to the left inner wall. A second magnetic sensor 17b is tightly attached to a front inner wall of the shielding shell 7 and fixed on a right side, but is not tangential to the right inner wall. The two sides are maintained at the same level. The humidity sensing module 9 is fixed on a bottom of the upper cover 6 of the shielding shell, tightly attached to the upper cover and fixed with a screw. The air inlet passage 3 penetrates into the shell through the shielding sleeve 5 and is connected with the humidity sensing module 9. The humidity sensing module 9 is connected with the air outlet passage 4, and the air outlet passage 4 goes through the shell through the shielding sleeve 5. The humidity sensing module may include a fan (a small fan is embedded into the humidity sensing module and encapsulated therein, not shown in the figure) capable of being controlled through positive and negative pulse therein. In case of the positive pulse, the fan may rotate positively, the air inlet passage may take the air inwards, and the air outlet passage may discharge the air. In case of the negative pulse, the fan may rotate negatively, the air inlet passage may discharge the air, and the air outlet passage may take the air inwards. The humidity sensing module is designed to prevent relative ambient humidity detection accuracy of a humidity sensor from being influenced due to blocking of a dustproof cover of the air inlet passage and the air outlet passage as a result of dust.

The magnetic photoacoustic composite non destructive testing device of the power transmission line of the photovoltaic grid based on the corona effect in the disclosure will be described below in detail in combination with drawings. The magnetic photoacoustic composite non destructive testing device of the power transmission line based on the corona effect is characterized in that a magnetic photoacoustic composite non destructive testing method is realized by accurately detecting the corona effect through multiple sensors.

From FIG. 4-FIG. 7, the composite non destructive testing device may include an electromagnetic shielding shell 7, the upper cover 6 of the shielding shell, the optical path shielding body 8, a first optical sensor probe 16a, a second optical sensor probe 16b, a dedicated S-shaped optical path passage 14, a hole 15 allowing an optical path to penetrate into the shielding shell, the shielding sleeve 5, two magnetic sensors 17a and 17b on an internal wall, the acoustic sensing module 10, the internal power supply management module 11, the micro-processor 12 and the signal conditioning and transmission unit 13 distributed on the bottom surface from the left to the right along the medial axis, and the humidity sensing module 9 under the upper cover 6 of the shell.

The electromagnetic shielding shell is made up of multiple layers of shielding structures and materials, and is not elaborated herein. The optical sensing module is embedded into the optical path shielding body, including the optical sensor probes 16a and 16b, and the dedicated S-shaped optical path passage 14 (degaussing) reserved for optical fibers to transmit a light beam. If the inside and the outside of the device are connected directly through a through hole, there may be a magnetic sensing line and an electric field line penetrating into the shielding body through a gap of the device. Therefore, an S-shaped embedded design is taken, which can effectively prevent an internal circuit from being interfered by a magnetic flux leakage. The optical sensing module enters into the shielding shell through the hole 15 penetrating through the shielding shell to connect with an optocoupler on the signal conditioning module 13. A signal is sent into one end of the voltage comparator after being subjected to photovoltaic conversion and AD conversion. Similarly, another symmetric optical path sends the processed signal to another end of the comparator finally, as to send the output signal to a General-Purpose Input/Output (GPIO, which is known by those skilled in the art and will not be elaborated) of the micro-processor 12. Meanwhile, two paths of analog signals passing the optocoupler may further be sent to the GPIO of the micro-processor 12 after being subjected to the AD conversion to implement quantification and separate analysis. An output of this pair of differential signals is one of criteria of judging whether there is strong corona caused by a broken cable.

The humidity sensing module 9 is fixedly mounted at a lower bottom of the upper cover of the electromagnetic shielding shell. An air current is sucked by an exhaust fan of the air humidity sensing module through the air inlet passage 3. The air is transformed as a voltage through the humidity sensing module, and the voltage is sent into the GPIO of the micro-processor 12 after being subjected to the AD conversion, as reference data and an environmental factor. The air is discharged through the air outlet passage 4. Because the dust in the air may cause blocking of the air inlet passage and other problems, the exhaust fan needs to be periodically ensured to rotate positively and reversely. In this way, the air inlet passage and the air outlet passage may be interchangeable, meanwhile the problem that the detection precision is influenced due to adhesion of the dust may be solved.

The front inner wall and the rear inner wall of the composite non-destructive device are respectively provided with the magnetic induction coil 17a and 17b, herein the two magnetic induction coils are fixed at the same, level symmetrically. In this way, the differential signal is formed and input to a signal conditioning terminal. A reason why the magnetic induction coils are configured like this is that the differential signal in the shielding body is conditioned is output as 0V after being subjected to conditioning if there is no corona due to breakage when the composite non destructive testing device is mounted just below or above a high-voltage line vertically, and when the mounted device swings around the high-voltage line, influence of swinging may still be neglected as long as the mounted device (for example, an unmanned aerial vehicle and an inspection robot) rotates around an axis and a distance from a central point of the coil to a high-voltage axis is equal. Therefore, there is a certain requirement for a mounting mode of the mounted device here. In case of the corona as a result of the breakage, a left (front) coil may sense a step signal first, while a right (rear) signal may not achieve a place where the corona as a result of the breakage occurs yet. Therefore, a certain signal (greater than DV and showing a positively correlated change with a degree of breakage) may be output by conditioning of the differential signal. There may be calculations corresponding to different shielding efficiency in allusion to the power transmission lines of different specifications here, and the shielding body may be designed differently. Therefore, in order to prevent the corona from generating an overvoltage or being applied to the power transmission lines of the different specifications, correction should be implemented before application (correction of a mounting position, an output electric potential is 0; correction of sensing, an output corona value should be not less than or greater than a corresponding detection threshold). An output of this pair of differential signals is also one of the criteria of judging whether there is the severe corona caused by the broken cable.

Due to existence of the magnetic induction coils 17a and 17b, new electromagnetic interference may also be introduced. In order to reduce secondary electromagnetic interference and improve reliability, a local shielding layer should be added to the internal important signals conditioning and transmission unit, the power supply management module and the micro-processor.

The acoustic sensing module 10 is mainly configured to capture a difference between a frequency generated by ionized air and a frequency of an inherent environment, and a difference between loudness of noise generated by the corona and loudness of noise in the inherent environment. An output of this signal is also one of the criteria of judging whether there is the severe corona caused by the broken cable.

The internal power supply management module 11 is configured to stabilize a voltage of an incoming power supply and ensure that the internal circuit runs normally. Meanwhile, the power supply module is provided with a positive/negative power supply and a PWM generator, as to specially provide power to a fan controlled by positive/negative pulse inside the humidity sensing module. The positive/negative power supply further provides the power to a signal conditioning circuit (including an amplifier) therein, and the positive power supply provides the power to the acoustic sensing module, the humidity sensing module, the optical sensing module (the optocoupler) and a minimum system.

A dedicated passage is reserved for a circuit connecting the inside with the outside of the device in the shielding sleeve 5 between the air inlet passage 3 and the air outlet passage 4. An apparatus (for example, the unmanned aerial vehicle, the inspection robot and the like) on which the composite non destructive testing device is mounted usually provides the power to the inside of the device. Detected data also needs to be transmitted outward to the mounted device.

The disclosure provides an embodiment of the abovementioned device and obtains an initial voltage with the magnetic sensor while obtaining initial humidity of the air with the humidity sensor, in this way a threshold of a detection environment is determined in the self-adapting manner. When it exceeds a normal threshold, an outer surface of the cable is initially determined to have the breakage (a fracture or a burr), and the interference due to the corona sensed through the air humidity and an inherent voltage is eliminated according to the magnetic field strength monitored by the magnetic sensor, light intensity obtained by an optical sensor, and a frequency and loudness of an acoustic sensor. Then, breakage information is sent into the processor first by the signal conditioning module for normalization and subjected to weighting with a Delphi method, as to determine and record a breakage point. The embodiment may specifically include the following steps.

In order to reduce power consumption of non destructive testing, the magnetic sensor, the humidity sensor and the corresponding signal conditioning and transmission unit are started first.

First, the initial voltage is obtained with the magnetic sensor, the first magnetic sensor obtains an induced voltage $V1$, and the second magnetic sensor obtains an induced voltage $V2$. Therefore, a differential voltage $V=V2-V1$ may be obtained. A magnetic induction differential signal V measured in this step is set to c after being subjected to normalization, and a weight is set to C.

Real-time ambient air humidity is obtained with the humidity sensor, in this way a threshold of a detection environment is determined with the micro-processor in a self-adapting manner on the basis of a voltage signal from the humidity sensor. When the threshold exceeds the normal threshold, it is initially determined that there is breakage (the fracture or the burr) on the outer surface of the cable. A normalized value of the signal from the humidity sensor is d, and D is a sensitivity coefficient that is artificially set.

According to the abovementioned steps, that whether the circuit is broken may be confirmed. If c does not exceed a pre-set threshold F when the air humidity is d, inspection is continued along a high-voltage circuit. If c is abnormal and exceeds the threshold, detection of the following steps is implemented.

Then, the acoustic sensing module is mainly configured to capture the frequency generated by the ionized air and the difference between the loudness of the noise generated by the corona and the loudness of the noise in the inherent environment, and convert the abovementioned frequency and the abovementioned loudness as the voltage. The frequency detected by the acoustic sensing module in the step is set to b1 after being subjected to normalization (the measured value is divided by a measured range), and a weight is set to B1. The detected loudness is set to b2 after being subjected to the normalization (the measured value is divided by a measured range), and a weight is set to B2 and it is set that $B=B1+B2$.

Second, two sides of the composite non destructive testing device are additively provided with the shielding bodies, and the dedicated degaussing S-shaped optical path passage reserved for the optical fibers to transmit the light beam is respectively configured inside the shielding bodies. The optical sensing module in the step may receive corona lights, and the corona lights may be converted as the voltage through the optocoupler inside the optical sensing module. The voltage after being subjected to the normalization (the measured value is divided by a measured range) is a, and a weight is set to A.

Finally, weighting is implemented with the Delphi method, and, the breakage point is confirmed and recorded. Where $A+B+C=1$, and $A>B>C>D>0$, it is set that $f=a\times A+b\times B+c\times C-d\times D$, and a deterministic parameter of the breakage is e, no breakage alarm will be given out if the micro-processor is taken to calculate $e>f$. Otherwise, an alarm signal will be given out, and a value f will be transmitted. Meanwhile, the breakage point is recorded in real time through a mounted sensing device (an aerial vehicle or the inspection robot).

What is claimed is:

1. A magnetic photoacoustic composite non destructive testing device of a power transmission line of a photovoltaic grid based on a corona effect, comprising a mechanical structure part and a data processing part; wherein
    the mechanical structure part comprises a shielding shell and a mounting base, shielding bodies are mounted on two sides of the shielding shell, a top of the shielding shell is provided with an upper cover, the two sides of the shielding shell under the upper cover are provided with the mounting base respectively, the two mounting bases are located above the shielding bodies respectively, mounting holes are uniformly distributed on the mounting base, and one end of the upper cover is provided with an air inlet passage and an air outlet passage; the air inlet passage and the air outlet passage run through a shielding sleeve, and are distributed on two sides of the shielding sleeve and tangential to the shielding sleeve;

the data processing part comprises a pair of optical sensing modules, a pair of magnetic sensing modules, an acoustic sensing module, a humidity sensing module, a micro-processor, a signal conditioning and transmission unit and an internal power supply management module; wherein each of the optical sensing modules comprises an optical probe, an optical fiber transmission passage, a photoelectric coupling module, and is connected with the signal conditioning and transmission unit; each of the magnetic sensing modules comprises a magnetic sensor, and is connected with a limiting circuit, a voltage comparator and a signal conditioning circuit; the acoustic sensing module is mainly configured to detect a loudness and a frequency of a sound given out in presence of the corona effect, and is connected with a filtering, amplifying and limiting signals conditioning circuit; the humidity sensing module is configured to detect a relative humidity of air, as to ensure that a threshold of the corona given out due to breakage is set and identified in a self-adapting manner; voltages of four groups of sensing modules are transmitted to a signal conditioning and change-over module, and then transmitted to a minimum system for decision judgment or storage or transmission;

the acoustic sensing module, the internal power supply management module, the micro-processor and the signal conditioning and transmission unit for conditioning acoustic, optical, magnetic, humidity and internal voltage signals are fixed on a medial axis on a bottom surface one by one, and are arranged one by one from left to right at regular intervals, and are kept an identical distance with a left inner wall and a right inner wall of the shielding shell; a first magnetic sensor is tightly attached to a rear inner wall of the shell and is fixed on a left side; a second magnetic sensor is tightly attached to a front inner wall of the shell and is fixed on a right side; the two sides of the shielding shell are maintained at the same level and are kept with a distance with the inner wall of the shell; the humidity sensing module is fixed on a bottom of an upper cover of the shielding shell, is tightly attached to the upper cover and is fixed with a screw; the air inlet passage penetrates into the shell through the shielding sleeve and is connected with the humidity sensing module; the humidity sensing module is connected with the air outlet passage, and the air outlet passage goes through the shell through the shielding sleeve; the humidity sensing module comprises a fan capable of being controlled through a positive and negative pulse therein; the fan is embedded into the humidity sensing module and encapsulated therein; in case of the positive pulse, the fan rotates positively, the air inlet passage takes air inwards, and the air outlet passage discharges the air; in case of the negative pulse, the fan rotates negatively, the air inlet passage discharges the air, and the air outlet passage takes the air inwards; and the humidity sensing module is designed to prevent relative ambient humidity detection accuracy of a humidity sensor from being influenced due to blocking of a dustproof cover of the air inlet passage and the air outlet passage as a result of dust.

2. The device as claimed in claim 1, wherein the magnetic sensor is an induction coil; the front inner wall and the rear inner wall of the shielding shell are respectively provided with a magnetic induction coil, and magnetic induction coils are fixed at the same level symmetrically, in this way a differential signal is formed and input to a signal conditioning terminal.

3. The device as claimed in claim 1, wherein the internal power supply management module in the device is configured to stabilize a voltage of an incoming power supply and ensure that an internal circuit runs normally; the internal power supply management module is further provided with a positive/negative power supply and a Pulse Width Modulation (PWM) generator, as to provide power to a drainage pump inside the humidity sensing module; the positive/negative power supply further provides power to the signal conditioning and transmission unit therein; the positive power supply provides power to the acoustic sensing module, the humidity sensing module, the optical sensing module, the micro-processor and the signal conditioning and transmission unit;

an apparatus on which the device is mounted usually provide power to the internal power supply management module inside the device; and detected data is transmitted outwards to the mounted device.

4. The device as claimed in claim 1, wherein the acoustic sensing module is mainly configured to capture a difference between a frequency generated by ionized air and a frequency of an inherent environment, and a difference between loudness of noise generated by corona and loudness of noise in the inherent environment; and an output of a signal is one of criteria of judging whether there is a severe corona caused by a broken cable.

5. The device as claimed in claim 1, wherein left and right sides of the device are additively provided with the shielding bodies, and dedicated degaussing S-shaped optical path passages reserved for optical fibers to transmit a light beam are provided inside the shielding bodies; and an output of an optocoupler inside the device is one of criteria of judging whether there is a severe corona caused by a broken cable.

6. The device as claimed in claim 1, wherein a space is formed inside the shielding sleeve between the air inlet passage and the air outlet passage, and the space is a dedicated passage reserved for a circuit connecting inside with outside of the device.

7. The device as claimed in claim 1, wherein a three-layer structure which is a shielding layer respectively made up of an aluminium foil layer, a silicon steel layer and a copper layer from outside to inside is applied to the shielding shell and the shielding sleeve; and in order to ensure that a signal is reliable and interference is decreased, a local shielding and isolating layer is added outside each of separate modules comprising the signal conditioning and transmission unit, the power supply management module and the micro-processor.

* * * * *